United States Patent [19]

McGuire

[11] 3,984,639
[45] Oct. 5, 1976

[54] ACTIVE FILTER
[75] Inventor: Ronald F. McGuire, Anaheim, Calif.
[73] Assignee: The Anaconda Company, New York, N.Y.
[22] Filed: May 1, 1975
[21] Appl. No.: 573,449

[52] U.S. Cl. .......................... 179/2.5 A; 330/109; 333/70 R
[51] Int. Cl.² ........................................ H03H 7/06
[58] Field of Search................. 179/2.5 A; 330/109; 333/70 R

[56] References Cited
OTHER PUBLICATIONS
A. Antoniou:, "Bandpass Transformation . . . Using FDNR Elements," IEEE Trans'ns. on CKT. Theory, Mar. 1971, pp. 297-298.

Primary Examiner—Thomas A. Robinson
Attorney, Agent, or Firm—William W. Haefliger

[57] ABSTRACT
An active filter comprises:
 a. a transmission line and a common, the line having an input side and an output side,
 b. first and second parallel paths each connected between the transmission line and the common, each path including series connected resistance and capacitance elements, and
 c. at least two amplifiers associated with each path, each amplifier having input and output terminals connected with different points along said path.

3 Claims, 5 Drawing Figures

ACTIVE FILTER

BACKGROUND OF THE INVENTION

This invention relates generally to active filters, and more particularly to filters employing frequency dependent negative resistors (FDNRs) useful in telephone carrier and signalling equipment.

Generally speaking, filters are used to separate desired signals from undesired signals, and they are extensively employed in telephone carrier equipment. The response of a filter can be mathematically expressed by means of a transfer function. In general, a designer knows the defining limits of the transfer function that is required; and filter tables can be searched to determine what passive inductance and capacitance ladder network satisfies this requirement. Additional references are available which allow the designer to construct the transfer function of the filter so chosen. Once the transfer function is known, the filter can be synthesised by an infinite number of RLC topologies. However, most of these topologies must use inductors which are expensive, bulky and less desirable than resistors and capacitors.

It has been known for some time that any transfer function realizable with passive resistors, capacitors, and inductors can be attained with amplifiers, resistors, and capacitors. To do this, one creates a topology that gives a transfer function of the same form as the passive RLC network. Then, by appropriately equating the coefficients, one creates a set of equations that can be solved to give appropriate values for the resistors, capacitors, and amplifier gains. There is no limit to the number of topologies that can be created, and the more common ones were proposed in a paper by Sallen and Key. However, all such topologies suffer a common shortcoming, which is high component sensitivities. With filters such as Cauer types, the requirements placed upon component accuracies to synthesize the transfer function accurately are formidable. This means a high manufacturing cost for the filters. It has been suggested by L. T. Burton that a better approach would be to scale a passive RLC network by multiplying all terms by 1/S. This transformation does not change the transfer function but transforms inductors into resistors, resistors into capacitors, and capacitors into frequency dependent negative resistors (FDNR).

SUMMARY OF THE INVENTION

It is a major object of the invention to provide an improved active filter useful in telephone carrier equipment and employing resistors, capacitors and frequency dependent negative resistors. The latter, in turn, include amplifiers, resistors and capacitors. Basically, the active filter comprises:
 a. a transmission line and a common, the line having an input side and an output side,
 b. first and second parallel paths each connected between the transmission line and the common, each path including series connected resistance and capacitance elements, and
 c. at least two amplifiers associated with each path, each amplifier having input and output terminals connected with different points along said path.

As will be seen, the two paths are preferably alike and the amplifier connections to the first path are like the amplifier connections to the second path. Also, there are typically five points of amplifier connection to each path, such points spaced sequentially along the path and separated by selected capacitance and resistance elements. Each amplifier has two inputs and an output, and one of the connection points is typically connected to one of the inputs to each amplifier.

Of advantage are the facts that component accuracies need not be nearly as critical as in Sallen and Key Topologies; inductors are not used; the filter is simpler and less expensive to construct than other known types; and the cost of telephone carrier equipment may be correspondingly reduced.

These and other objects and advantages of the invention will be more fully understood from the following description and drawings, in which:

DRAWING DESCRIPTION

FIGS. 1–5 are circuit diagrams.

DETAILED DESCRIPTION

Figure 1:
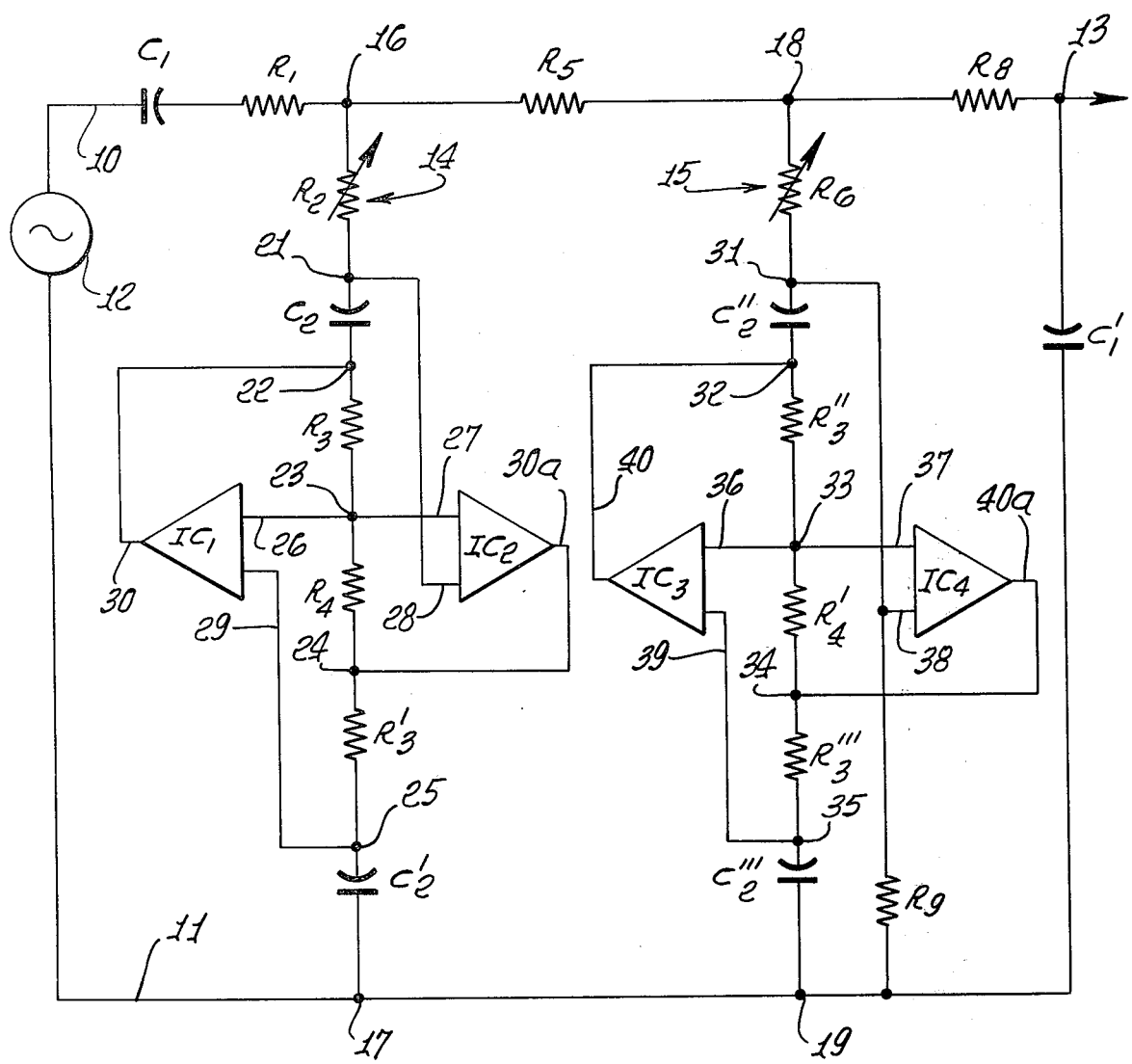

In FIG. 1, a telephone trunk or transmission line and common are shown at 10 and 11, a telephone carrier signal generator (with appropriate modulation) being represented at 12. Capacitance and resistance elements $C_1$, $R_1$, $R_5$ and $R_8$ are connected in series in line 10, and a capacitor $C_1{}^1$ is connected between the common and the output point 13.

The filter includes first and second parallel paths indicated for example at 14 and 15, each connected between the transmission line and the common. Path 14 is connected between points 16 and 17, and path 15 between points 18 and 19. Each path includes series connected resistance and capacitance elements, and typically path 14 includes elements $R_2$, $C_2$, $R_3$, $R_4$, $R_3'$ and $C_2'$ connected in series, as shown. Likewise, path 15 contains similar and corresponding elements $R_6$, $C_2''$, $R_3''$, $R_4'$, $R_3'''$ and $C_2'''$ connected in series. Resistors $R_2$ and $R_6$ may be variable, as shown. Accordingly, the paths 14 and 15 are alike.

The filter also includes at least two operational amplifiers associated with each path, each amplifier having input and output terminals connected with different points along the path. Typically, the amplifier connections to the first path are similar to, or like, the amplifier connections to the second path; thus, there are five such connection points along each path, and one of the points is connected with an input to each of the two amplifiers associated with that path. For example, the five connection points in path 14 are designated 21–25; one point 23 is connected with the inputs 26 and 27 to the respective amplifiers $IC_1$ and $IC_2$; the points 21 and 25 furthest from point 23 are respectively connected with the inputs 28 and 29 to the amplifiers $IC_2$ and $IC_1$; the output 30 of amplifier $IC_1$ is connected with intermediate point 22; and the output 30a of amplifier $IC_2$ is connected with intermediate point 24. Note that the points 21–25 are separated from one another by the elements $C_2$, $R_3$, $R_4$ and $R_3'$, as shown, that points 16 and 21 are separated by resistor $R_2$, and points 25 and 17 are separated by capacitor $C_2'$.

In similar manner, there are five connection points 31–35 along path 15; one point 33 being connected with the inputs 36 and 37 to the respective amplifier $IC_3$ and $IC_4$; the points 31 and 35 furthest from point 33 are respectively connected with the inputs 38 and 39 to the amplifiers $IC_3$ and $IC_4$; the output 40 of amplifier $IC_3$ is connected with intermediate point 32; and the output 40a of amplifier $IC_4$ is connected with intermediate point 34. Note that the points 31–35 are separated from one another by elements $C_2''$, $R_3''$, $R_4'$, and $R_3'''$, as shown, that points 18 and 31 are separated by variable resistor $R_6$, and points 19 and 35 are separated by capacitor $C_2'''$. In addition, a resistor $R_9$ connects points 31 and 19.

Figure 2:
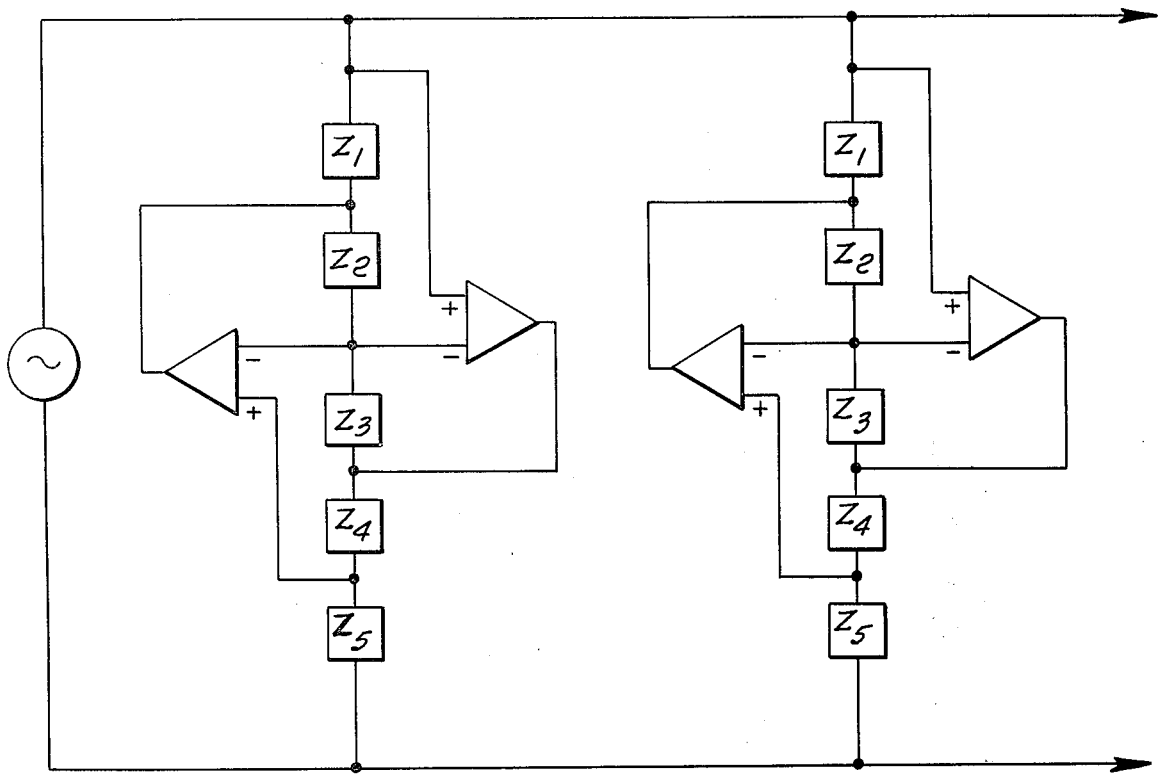

A more generalized circuit appears in FIG. 2, wherein the resistors and capacitors in the two parallel paths or branches are indicated by the impedances $Z_1$ to $Z_5$. In this regard, it can be shown that, for each branch, $$Z_{DP} = \frac{(Z_1)(Z_3)(Z_5)}{(Z_2)(Z_4)} \quad (1)$$

where $Z_{DP}$ = driving point impedance.

The above assumes ideal operational amplifiers with infinite input impedance, zero output impedance and infinite gain.

Figure 3:
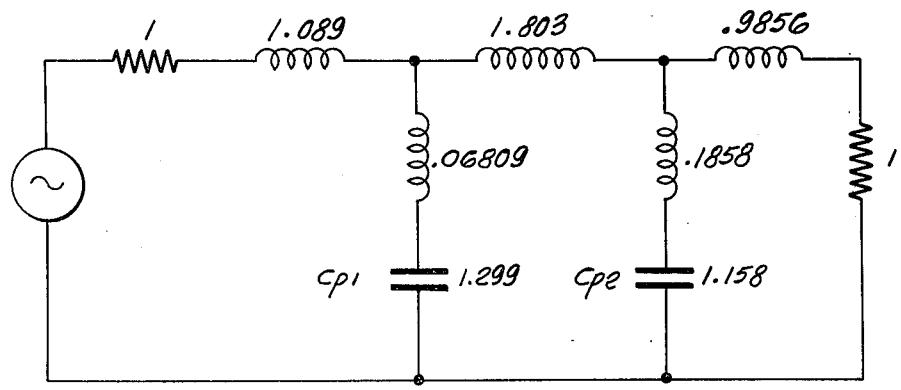

Let it be supposed that a five pole Cauer low pass filter has a cut-off frequency $f_c = 3{,}500$ Hz, $A_s=60$DB minimum, and ripple $\cong 1/10$ DB. A CO5-15-29 filter satisfying these requirements is shown in FIG. 3. It then becomes necessary to change the inductors to resistors, change the resistors to capacitors, change the capacitors to FDNR'S, and to choose elements of equation (1) such that $Z_{DPn} = D_n$ at $\omega_o$, where $\omega_o = 2\pi f_c$.

Figure 4:
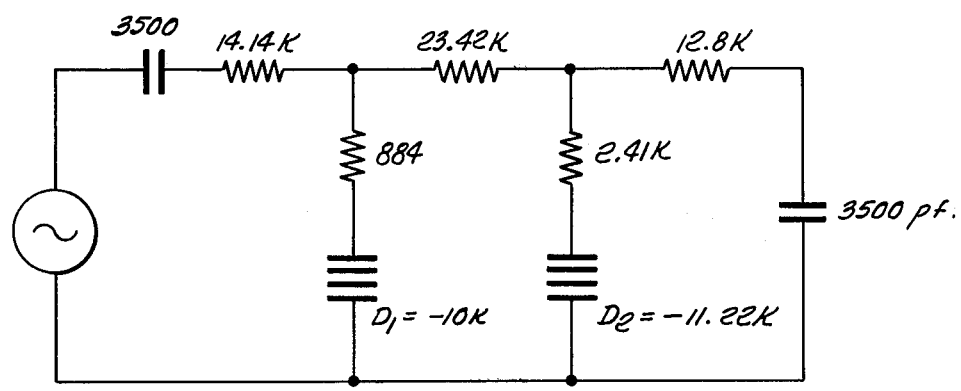

First, changing capacitors of FIG. 3 to $D_1$ and $D_2$ values in FIG. 4, choose $D_1$ to be negative. It is defined as follows:

$$-D_1 = \frac{K}{C_{p1}} \quad (2)$$

Choosing $D_1 = -10{,}000$, then $$K = 10{,}000 \times 1.299 = 12{,}990$$

Since $$-D_n = \frac{K}{C_{pn}} = \left(\frac{C_{p1}}{C_{pn}}\right) D_1, \quad (3)$$

Then $$D_2 = \frac{-K}{C_{p2}} = -\frac{12{,}990}{1.158} = -11.218$$

Next, change the $L_n$ inductors of FIG. 3 to $R_p$ resistors, and scale to produce FIG. 4 $R_n$ resistors in accordance with the following equation:

$$R_n = R_p K, \quad (4)$$

The $L_n$, $R_p$ and $R_n$ values are as set forth in the following table:

| $L_n$(H) | $R_p(\Omega)$ | $R_n(\Omega)$ |
|---|---|---|
| 1.089 | 1.089 | 14.146 K |
| .06809 | .06809 | 884.49 |
| 1.803 | 1.803 | 23.421 K |
| .1858 | .1858 | 2.413 K |
| .9856 | .9856 | 12.802 K |

Next, the resistors $C_p$ of FIG. 3 are changed to FIG. 4 capacitors $C_n$ as follows:

$$C_n = \frac{C_n}{\omega_o K} \quad (5)$$

Substituting values, $$C_n = \frac{1}{(2.199 \times 10^4)(1.299 \times 10^4)}$$

$$C_n = 3500.8 \, pf.$$

Finally, the elements of Equation (1) are to be chosen and determined, for each of the paths in which $D_1$ and $D_2$ are located. For the first path, and substituting in Equation (1), $$Z_{DPn} = D_1 = -10{,}000 = \frac{(Z_1)(Z_3)(Z_5)}{(Z_2)(Z_4)} \quad (6)$$

Let $Z_2 = Z_4 = 100$ K $\Omega$, and
Let $Z_3 = 10$ k $\Omega$, and
Let $Z_1$ and $Z_5$ be capacitors.

Then, $$-10{,}000 = \frac{(10 K)(Z_1)(Z_5)}{(100 K)(100 K)} \quad (7)$$

or, $$Z_1{}^2 = \left(\frac{1}{2\omega_o C}\right)^2 = -1 \cdot 10^{10}$$

and, solving for C, the values of the two capacitors $Z_1$ and $Z_5$ are:

$$C = \sqrt{\frac{1}{\omega_o{}^2 \cdot 10^{10}}}, \text{ or}$$

$$C = 454.75 \, pf$$

For the second path, in which $D_2$ is located,
Let $Z_2 = Z_4 = 100 \, K\Omega$
Let $Z_1$ and $Z_5$ be capacitors whose values are 455 $pf$ as in the first path.
Then, setting $Z_{DPn} = D_2 = -11218$ in equation (6), and solving for $Z_3$:

$$Z_3 = 11.23 \, K\Omega$$

Figure 5:
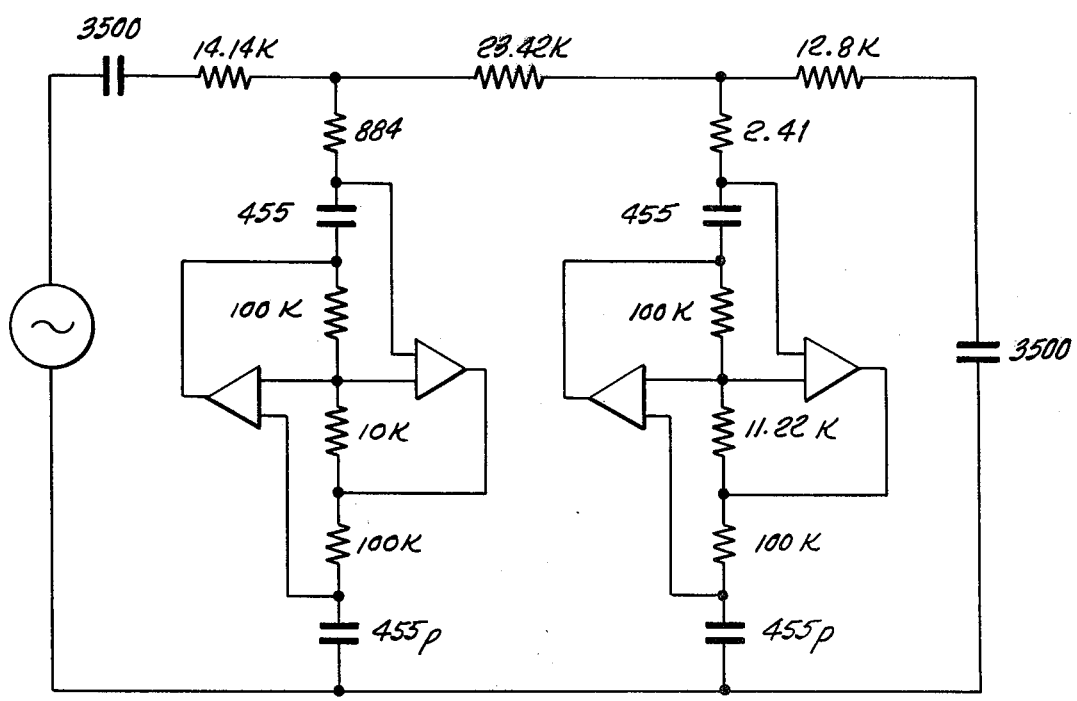

The resultant circuit appears in FIG. 5.

The operational amplifiers may, for example, be Model 741 amplifiers, produced by several companies such as Texas Instruments, Motorola and Fairchild Camera.

I claim:
1. In telephone carrier and/or signaling circuitry, or the like, an active filter comprising
   a. a transmission line and a common, the line having an input side and an output side, there being a source of telephone carrier signals connected with the input side of the transmission line,
   b. first and second parallel paths each connected between the transmission line and the common, each path including series connected resistance and capacitance elements, and
   c. at least two amplifiers associated with each path, each amplifier having input and output terminals connected with different points along said path, each amplifier having two inputs and an output, and
   d. there being five amplifier connection points in sequence along each said path, said points separated by selected resistance and capacitance ele- ments, one of said points in each path connected with an input to each amplifier associated with each path, the second and fourth of said points being respectively connected with the outputs of the two amplifiers, each of said second and fourth points separated from said one point, which is third point, by a resistance element, the first and fifth of said points being respectively connected with the other inputs of the two amplifiers, the first and second points separated by a capacitance element, and the fourth and fifth points separated by a resistance element, a resistor being connected in series between the transmission line and the first point, and a capacitor being connected in series between the fifth point and the common.

2. The filter of claim 1 including a shunt capacitor connected between the transmission line and common and a resistor in the transmission line and connected in series between the point at which one of said paths is connected with the transmission line and the point at which said shunt capacitor is connected with the transmission line.

3. The filter of claim 1 wherein said resistor connected in series between the transmission line and the first point is a variable resistor.

* * * * *